(12) United States Patent
Wong et al.

(10) Patent No.: US 7,214,606 B2
(45) Date of Patent: May 8, 2007

(54) METHOD OF FABRICATING A WIRE BOND WITH MULTIPLE STITCH BONDS

(75) Inventors: Yam Mo Wong, Singapore (SG); Chee Wai Siew, Singapore (SG); Wei Liu, Singapore (SG); Zuo Cheng Shen, Singapore (SG)

(73) Assignee: ASM Technology Singapore Pte Ltd., Singapore (SG)

( * ) Notice: Subject to any disclaimer, the term of this patent is extended or adjusted under 35 U.S.C. 154(b) by 132 days.

(21) Appl. No.: 10/798,053

(22) Filed: Mar. 11, 2004

(65) Prior Publication Data

US 2005/0202621 A1 Sep. 15, 2005

(51) Int. Cl.
*H01L 21/44* (2006.01)
*H01L 23/48* (2006.01)
*B23K 31/02* (2006.01)

(52) U.S. Cl. .................... 438/617; 257/784; 228/180.5

(58) Field of Classification Search .................... None
See application file for complete search history.

(56) References Cited

U.S. PATENT DOCUMENTS

| | | | | |
|---|---|---|---|---|
| 4,415,115 A * | 11/1983 | James | ..................... | 228/170 |
| 6,426,563 B1 * | 7/2002 | Fujihira | ..................... | 257/780 |
| 6,583,483 B2 * | 6/2003 | Masumoto et al. | ......... | 257/459 |
| 6,602,778 B2 * | 8/2003 | Manning et al. | ............ | 438/617 |
| 6,774,494 B2 * | 8/2004 | Arakawa | ..................... | 257/779 |
| 6,815,836 B2 * | 11/2004 | Ano | ............................ | 257/784 |
| 7,064,433 B2 * | 6/2006 | Wong et al. | ................ | 257/737 |
| 2003/0230796 A1 * | 12/2003 | Ismail et al. | ................ | 257/686 |

* cited by examiner

*Primary Examiner*—Alonzo Chambliss
(74) *Attorney, Agent, or Firm*—Ostrolenk, Faber, Gerb & Soffen, LLP

(57) ABSTRACT

The invention provides a wire bond bonding a wire to a connection pad of an electronic device, and a method of forming the wire bond. A first stitch bond is formed on the connection pad, and a second stitch bond is next formed on the connection pad that is contiguous with the first stitch bond.

15 Claims, 2 Drawing Sheets

METHOD OF FABRICATING A WIRE BOND WITH MULTIPLE STITCH BONDS

FIELD OF THE INVENTION

The invention relates to the use of conductive wire to establish an electrical connection for linking connection pads of electronic devices, and in particular to a wire bond that is formed to attach the wire to a connection pad.

BACKGROUND AND PRIOR ART

During semiconductor assembly processes, there is sometimes a necessity to make electrical connections between connection pads of electronic devices. The electrical connections can be formed by using conductive wires to establish linkages between the connection pads. The most widely used wire materials are Gold (Au) and Aluminum (Al), but Silver (Ag) and Copper (Cu) are also used. The connection pads may comprise metallized bond sites on a semiconductor chip or on interconnection substrates. A wire bond secures the wire to the connection pad in order to ensure that the electrical connection is secure and the wire is not easily dislodged from the connection pad.

There is typically a first bonding position where a first wire bond is made and a second bonding position where a second wire bond is made. Generally, the wire bonding process involves feeding a conductive wire through a capillary of a wire bonding device and using the capillary to manipulate and bond the wire.

A typical wire bonding process is hereinafter described. The capillary is first located over a first bonding position. A clamp controlling the wire opens and wire extends out of the capillary. An electro flame-off spark is generated to create a free air ball at a tail of the wire and the capillary moves towards the first bonding position with the free air ball. The free air ball is placed onto the first bonding position, and ultrasonic energy and pressure is applied onto the ball to create a first wire bond between the wire and the connection pad at the first bonding position.

After the first bond is made, the capillary moves away from the first bonding position and wire is extended by the capillary as the capillary is moved towards the second bonding position in order to form a wire loop. The capillary moves to the second bonding position and presses the wire onto second bonding position. Ultrasonic energy and pressure is applied onto the wire and stitch bonding is performed to the wire at the capillary tip, thereby stitching the wire to the connection pad at the second bonding position. After the second bond is made, the capillary moves away from the connection pad at which point the wire has been bonded between two points. As the capillary moves away from the second bonding position, the clamp is closed such that the wire is pulled and severed from the wire bond made at the second bonding position.

It may be difficult to form a sufficiently strong stitch bond at the second bonding position for certain types of connection pads using conventional stitch bonding. The stitch pull tolerance of the wire bond, which is the amount of pulling force the wire bond can withstand before dislocation, is usually small and the stitch quality is not good, especially when conventional stitch bonding is utilized for ultra-fine pitch wire bonding. If the bond is not strong, the wire may be easily pulled away from the connection pad, leading to unreliability of the electrical connection made. In order to increase the bond strength, special bonding techniques were developed, such as the so-called ball bond on stitching ("BBOS") or ball stitching on bond ("BSOB").

BBOS involves placing a ball bump on top of the stitch bond already made at the second bonding position. The process is described in U.S. Pat. No. 5,960,262 entitled "Stitch Bond Enhancement for Hard-to-Bond Materials". On the other hand, BSOB involves first forming a ball bump at the second bonding position, before placing a stitch bond on top of the ball bump. This process is described in U.S. Pat. No. 5,328,079 entitled "Method and Arrangement for Bond Wire Connecting Together Certain Integrated Circuit Components". Both these methods assist in increasing a contact area between a wire bond and a connection pad so as to increase their degree of intermetallization.

However, the said BBOS and BSOB techniques present some problems. Although they serve to improve the strength of the second stitch, they may cause sway wire or snake wire problems due to the construction of the bonds. Sway wire refers to a tendency for the wire loop to deviate from a straight line passing through the connection pads at the first and second bonding positions and therefore threaten to contact adjacent wire loops, which might cause a short-circuit. This is sometimes due to the fact that the ball bump does not sufficiently anchor the wire to prevent sideways motion. Snake wire refers to a tendency of the wire in the capillary to recoil after a wire is broken at the second bond position when forming a ball bump, thus affecting the linearity of the wire for the next bond. There is at present no effective way to solve these problems with the BBOS and BSOB techniques. Furthermore, the BBOS and BSOB techniques require a longer bonding cycle time because of the need to form a ball bump in addition to forming a stitch bond.

SUMMARY OF THE INVENTION

It is therefore an object of the invention to improve bond quality and stitch pull tolerance of a wire bond while avoiding some of the aforesaid disadvantages of the prior art.

According to a first aspect of the invention, there is provided a method of forming a wire bond bonding a wire to a connection pad of a semiconductor device, comprising the steps of forming a first stitch bond on the connection pad, and forming a second stitch bond on the connection pad that is contiguous with the first stitch bond.

According to a second aspect of the invention, there is provided a wire bond bonding a wire to a connection pad of a semiconductor device, comprising a first stitch bond on the connection pad and a second stitch bond on the connection pad that is contiguous with the first stitch bond.

It would be convenient hereinafter to describe the invention in greater detail by reference to the accompanying drawings which illustrate one embodiment of the invention. The particularity of the drawings and the related description is not to be understood as superseding the generality of the broad identification of the invention as defined by the claims.

BRIEF DESCRIPTION OF THE DRAWINGS

Examples of a method of forming a wire bond in accordance with the invention will now be described with reference to the accompanying drawings, in which.

DETAILED DESCRIPTION OF THE PREFERRED EMBODIMENT

Figure 1:
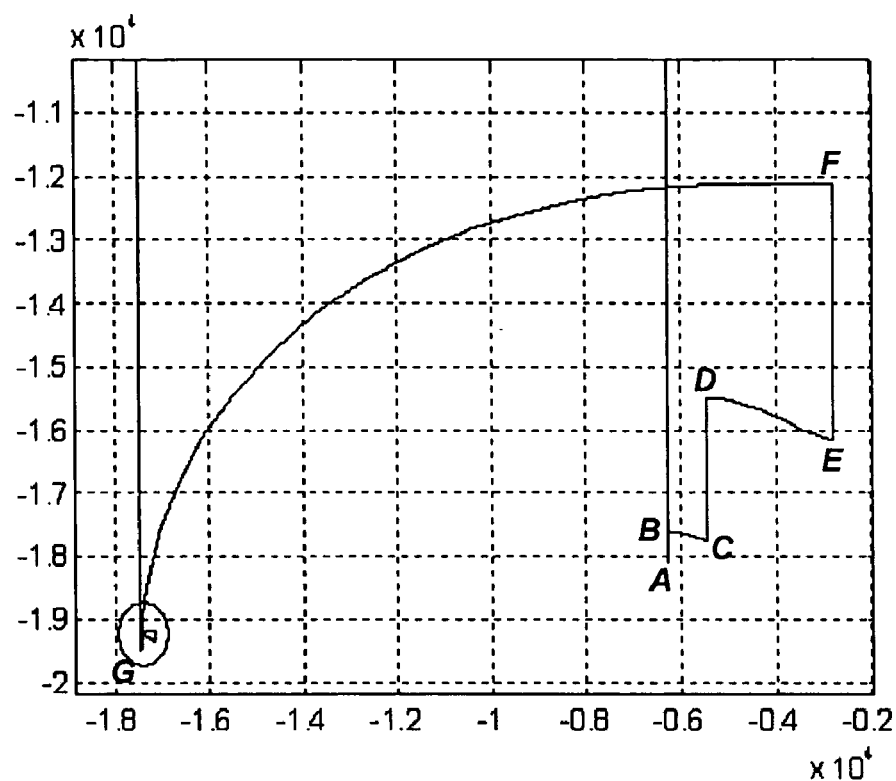
FIG. 1 shows a motion profile of a tip of a capillary used for bond formation moving from a first bonding position to a second bonding position.

FIG. 1 shows a motion profile of a tip of a capillary used for bond formation moving from a first bonding position to a second bonding position. The capillary is used for feeding wire to make electrical connections between separate connection pads and for controlling the formation of wire bonds.

The capillary with a free air molten ball formed at a tail of the wire by an electro flame-off spark is first lowered onto a first bonding position at point A. Ultrasonic energy and pressure is applied at point A to form a ball bond, and the capillary then moves up slightly to point B. The capillary is moved in a direction away from a second bonding position to point C in a reverse motion, then is moved vertically up to point D and away from the second bonding position to point E in another reverse motion. While moving vertically up to point F from point E, wire is extended from the capillary in preparation to form a wire loop linking the first and second bonding positions. Reverse motions such as that from points B to F are typically utilized to lower a height of a wire loop that is subsequently formed.

From point F, the capillary is then moved in a loop motion to the second bonding position at point G while extending the wire. A loop is therefore formed from the first bonding position at point A to the second bonding position at point G. At point G, stitch bonding is performed to complete the electrical connection between the connection pads. After stitch bonding, the capillary is lifted away from point G, and the wire is broken.

Figure 2:
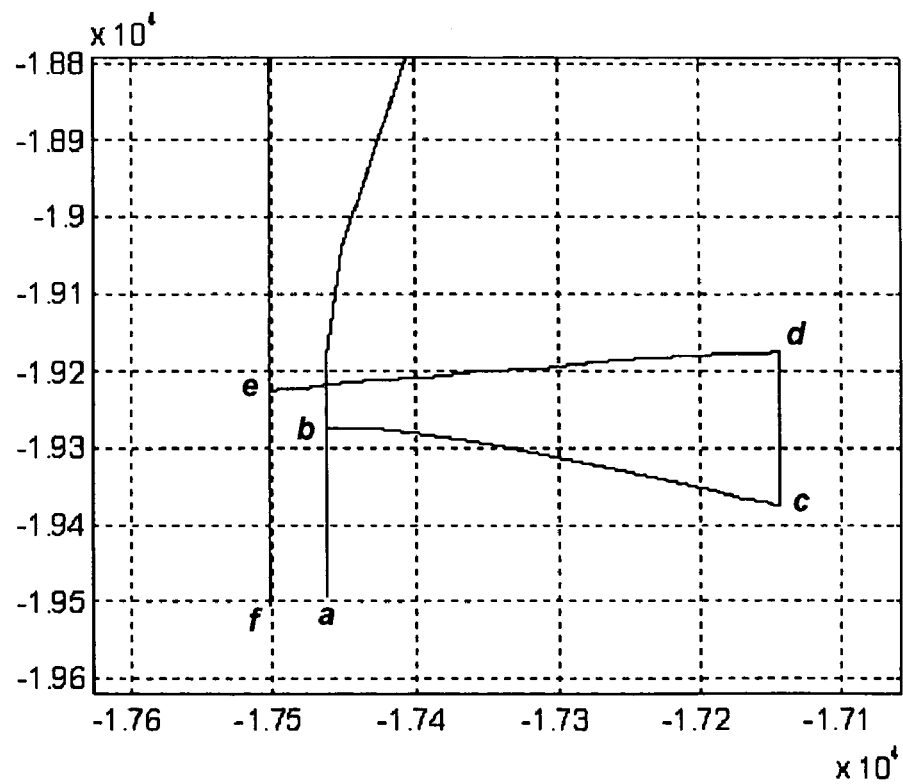
FIG. 2 shows an amplified view of the circled area at point G of FIG. 1 illustrating a stitch bonding motion profile according to the preferred embodiment of the invention.

FIG. 2 shows an amplified view of the circled area at point G of FIG. 1 illustrating a stitch bonding motion profile according to the preferred embodiment of the invention. This motion profile may be used to form a first stitch bond on the connection pad, and a second stitch bond on the connection pad that is contiguous with the first stitch bond. At the second bonding position generally at point G, the capillary brings the wire onto the surface of the connection pad at point a. A first stitch bond is formed at point a by applying ultrasonic energy and pressure onto the wire.

Figure 3:
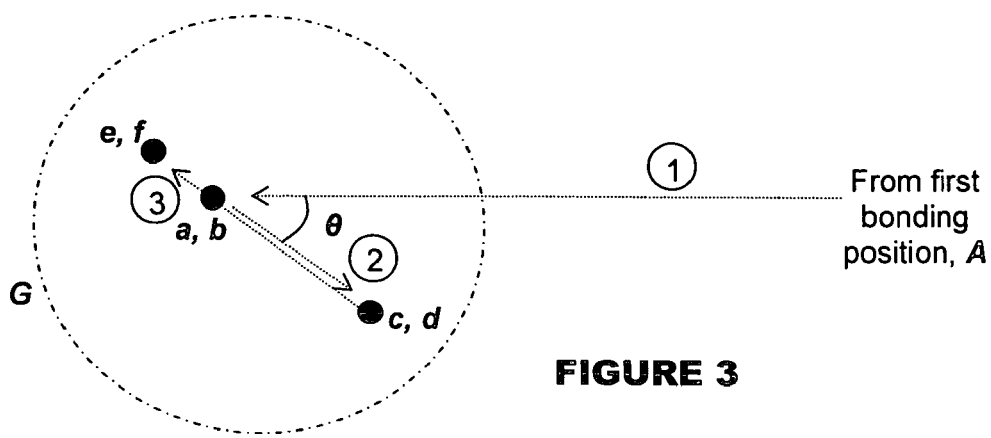
FIG. 3 shows a plan view of the circled area at point G of FIG. 1 illustrating the formation of a second stitch bond at a different orientation from a first stitch bond.

Thereafter, the capillary is lifted to point b and moved in the direction of the first bonding position to point c in a reverse motion. FIG. 3 shows a plan view of the circled area at point G of FIG. 1 illustrating the formation of the second stitch bond at a different orientation from the first stitch bond. As illustrated in FIG. 3, during the reverse motion, it is preferable that the capillary is moved from point b to point c at an angle θ to a direction moved by the capillary from the first bonding position, A to the second bonding position, G. The reverse motion direction is therefore also different to a direction that the first stitch bond is oriented by angle θ. This helps to improve the stitch pull tolerance and minimize the risk of snake wire being created that might affect the next bond to be made.

The capillary is then lifted vertically to point d, before moving in a flex motion to point e in a direction that is opposite to the reverse motion direction from point b to point c. Point e is over the second bonding position at a predetermined search height. FIG. 3 shows that the direction of motion from point d to point e on a plan view is also at an angle θ to a direction moved by the capillary from the first bonding position, A to the second bonding position, G.

Point e is slightly horizontally offset from the first stitch bond that was made at point a so that a center of the second stitch bond position is offset from a center of the first stitch bond position. During the various motions, the wire clamp is open and feeds out a short length of wire as the capillary moves from point a to point e. The capillary and wire are lowered onto the connection pad at point f, and a second stitch bond is formed adjacent to the first stitch bond using ultrasonic energy and pressure to smash the wire. The capillary is then lifted away from point f after forming the second stitch bond. The wire clamp is closed and the wire is severed from the second stitch bond. The capillary is now ready to make another electrical connection, and the next bonding cycle can begin.

The distance between the first stitch bond and the second stitch bond can be adjusted by the software controlling the capillary, but it is preferable that the second stitch bond overlaps the first stitch bond to some degree so as to increase the contact area between the wire bond comprising the two stitch bonds and the connection pad. The process can be continued such as by forming an additional stitch bond contiguous with the first and/or second stitch bond. By forming multiple stitch bonds, the stitch pull tolerance can be significantly improved.

Figure 4A:
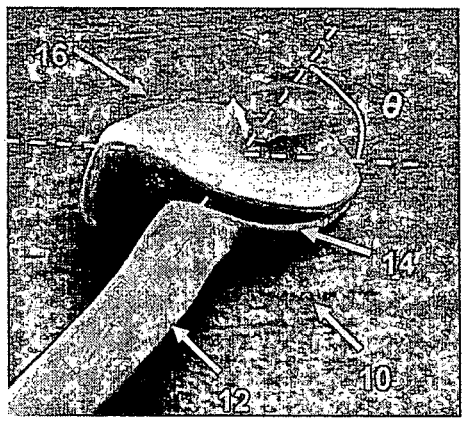
FIGS. 4a to 4d illustrate various views of a double-stitch wire bond formed according to the preferred embodiment of the invention.

FIGS. 4a to 4d illustrate various views of a double-stitch wire bond 10 formed according to the preferred embodiment of the invention. Referring to FIG. 4a, the wire bond 10 is located at a second bonding position. A bonding wire 12 extends from a first bonding position to this second bonding position. At the end of the bonding wire 12, a first stitch bond 14 in the shape of a crescent bonds the bonding wire 12 to the connection pad. A second stitch bond 16 is formed on top of the first stitch bond 14 and partially lies on or overlaps the first stitch bond 14 while also being in partial contact directly with the connection pad.

Also illustrated in FIG. 4a is an angle θ representing approximately the angle by which the capillary is moved relative to the line of motion between the first and second bonding positions during the reverse motion undertaken after forming the first stitch bond (see movement from point b to c in FIG. 2). Therefore, the angles of orientation of the crescent-shaped first stitch bond 14 and second stitch bond 16 are offset from each other by angle e, which has the attendant advantages of improving stitch pull tolerance and minimizing risk of snake wire creation as mentioned above. Accordingly, the second stitch bond 16 is also oriented in a different direction relative to the length of wire 12 connected to the wire bond 10.

Figure 4B:
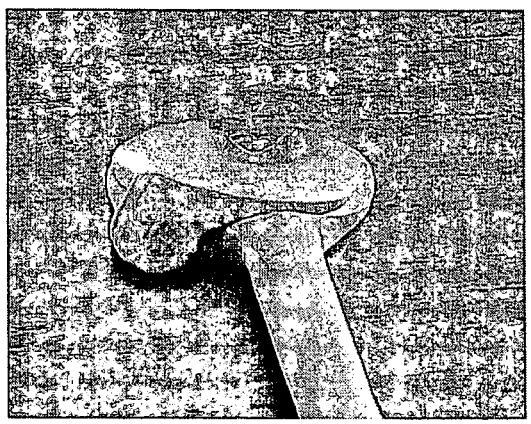
Figure 4C:
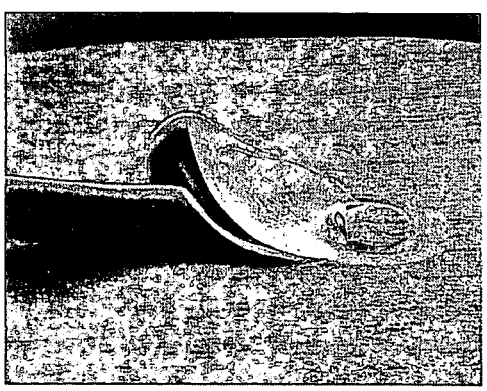
Figure 4D:
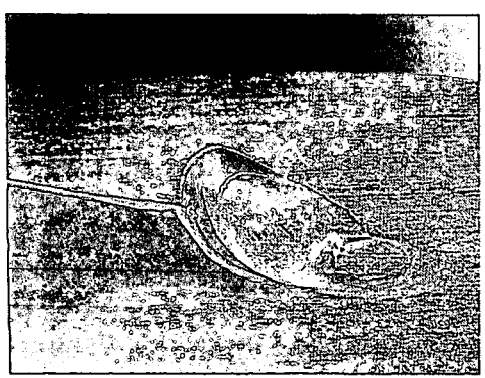

FIGS. 4b to 4d illustrate different viewing angles of the wire bond 10 shown in FIG. 4a and will not be described in further detail.

It would be appreciated that the preferred embodiment of the invention helps to improve stitch strength and stitch quality as compared to normal bonding using a single stitch bond. The problems of sway wire and snake wire are also less serious as compared with using so-called BBOS and BSOB techniques. Furthermore, the bonding cycle time can be decreased as compared to BBOS and BSOB techniques. By adjusting the direction of motion of the capillary between first and subsequent stitch bonds, it is relatively easy to change the shape and orientation of a multiple-stitch wire bond and acquire an improved stitch pull tolerance.

The invention described herein is susceptible to variations, modifications and/or additions other than those specifically described and it is to be understood that the invention includes all such variations, modifications and/or additions which fall within the spirit and scope of the above description.

The invention claimed is:

1. A method of forming a wire bond bonding a wire to a connection pad of an electronic device, comprising the steps of forming a first stitch bond on the connection pad, forming a second stitch bond on the connection pad that is contiguous with the first stitch bond, and then severing the wire from the second stitch bond such that wire terminates at the second stitch bond.

2. A method as claimed in claim 1, wherein the second stitch bond partially lies on the first stitch bond and partially lies on the connection pad.

3. A method as claimed in claim 1, wherein a position of the second stitch bond is offset from a position of the first stitch bond.

4. A method as claimed in claim 1, including arranging the second stitch bond such that it is oriented in a different direction relative to the orientation of the first stitch bond.

5. A method as claimed in claim 1, including arranging the second stitch bond such that it is oriented in a different direction relative to a length of wire connected to the wire bond.

6. A method as claimed in claim 1, wherein the wire is fed from a capillary, and including the step of moving the capillary in a reverse motion direction that is different to a direction that the first stitch bond is oriented after making the first stitch bond and before making the second bond.

7. A method as claimed in claim 6, including moving the capillary in a direction that is opposite to the reverse motion direction to a second stitch bonding position to form the second stitch bond.

8. A method as claimed in claim 1, including forming an additional stitch bond on the connection pad that is contiguous with the first stitch bond and/or second stitch bond.

9. A wire bond bonding a wire to a connection pad of an electronic device, comprising a first stitch bond on the connection pad and a second stitch bond terminating on the connection pad that is contiguous with the first stitch bond, and formed such that the wire terminates at the second stitch bond.

10. A wire bond as claimed in claim 9, wherein the second stitch bond partially lies on the first stitch bond and partially lies on the connection pad.

11. A wire bond as claimed in claim 9, wherein a position of the second stitch bond is offset from a position of the first stitch bond.

12. A wire bond as claimed in claim 9, wherein the second stitch bond is oriented in a different direction relative to the orientation of the first stitch bond.

13. A wire bond as claimed in claim 9, wherein the second stitch bond is oriented in a different direction relative to a length of wire connected to the wire bond.

14. A wire bond as claimed in claim 9, including an additional stitch bond on the connection pad that is contiguous with the first stitch bond and/or second stitch bond.

15. A semiconductor device comprising:
a wire;
a connection pad; and
a wire bond connecting the wire to the connection pad, wherein the wire bond comprises:
a first stitch bond on the connection pad and a second stitch bond terminating on the connection pad that is contiguous with the first stitch bond, and formed such that the wire terminates at the second stitch bond.

* * * * *